United States Patent
Jau et al.

(10) Patent No.: US 9,173,312 B1
(45) Date of Patent: Oct. 27, 2015

(54) CABLE STORAGE UNDER A DRAWER

(71) Applicant: Quanta Computer Inc., Tao Yuan Shien (TW)

(72) Inventors: Maw-Zan Jau, Tao Yuan Shien (TW); Chao-Jung Chen, Tao Yuan Shien (TW); Chih-Ming Chen, Tao Yuan Shien (TW); Wei-Cheng Tseng, Tao Yuan Shien (TW); Chung-Hsin Tsai, Tao Yuan Shien (TW)

(73) Assignee: Quanta Computer Inc., Tao Yuan Shien (TW)

( * ) Notice: Subject to any disclaimer, the term of this patent is extended or adjusted under 35 U.S.C. 154(b) by 0 days.

(21) Appl. No.: 14/542,148

(22) Filed: Nov. 14, 2014

(30) Foreign Application Priority Data

Apr. 30, 2014 (TW) .............................. 103115548 A
Aug. 4, 2014 (TW) .............................. 103126609 A

(51) Int. Cl.
*A47B 81/00* (2006.01)
*H05K 5/02* (2006.01)
*A47B 88/04* (2006.01)
*A47B 96/00* (2006.01)

(52) U.S. Cl.
CPC .............. *H05K 5/0247* (2013.01); *A47B 88/04* (2013.01); *A47B 96/00* (2013.01)

(58) Field of Classification Search
CPC ............ H02B 1/21; H02B 1/202; H04Q 1/16; H04Q 1/068; H04Q 1/141; A47B 21/06; A47B 2021/066; B60R 16/0215
See application file for complete search history.

(56) References Cited

U.S. PATENT DOCUMENTS

| | | | | |
|---|---|---|---|---|
| 4,672,805 A * | 6/1987 | Moritz | ............................ | 59/78.1 |
| 4,789,120 A * | 12/1988 | Spidel | ............................. | 248/49 |
| 4,840,023 A * | 6/1989 | Borsani | .......................... | 59/78.1 |
| 5,443,312 A * | 8/1995 | Schluter | ................... | 312/334.27 |
| 5,649,415 A * | 7/1997 | Pea | ................................. | 59/78.1 |
| 5,682,277 A | 10/1997 | Hanson | | |
| 5,788,347 A | 8/1998 | Rabinovitz | | |
| 5,897,178 A | 4/1999 | Ohara et al. | | |
| 6,070,742 A * | 6/2000 | McAnally et al. | .............. | 211/26 |
| 6,142,590 A * | 11/2000 | Harwell | ..................... | 312/223.1 |
| 6,416,022 B1 * | 7/2002 | Crespi | .............................. | 248/49 |

(Continued)

FOREIGN PATENT DOCUMENTS

EP 1111747 6/2001

OTHER PUBLICATIONS

"Power and Cabling Products", Communications News (Jun. 7, 2010) 40(10).

(Continued)

*Primary Examiner* — Hanh V Tran
(74) *Attorney, Agent, or Firm* — Novak Druce Connolly Bove + Quigg LLP

(57) ABSTRACT

An apparatus comprising a wall of a drawer adapted to secure a set of cables at a first end, the set of cables can be housed in a cable housing, the wall coupled to a roller and a flattening appendage. In some implementations, the apparatus can include a deck including a plate adapted to secure the set of cables at a second end, the plate located at a midpoint of the deck. Alternatively, a drawer is adapted to slide along the deck, a shelf attached to the drawer. The flattening appendage presses down on the first end of the set of cables and the roller presses down on the second end of the set of cables as the drawer is opened and closed such that the set of cables is stored neatly under the drawer.

20 Claims, 7 Drawing Sheets

(56) References Cited

U.S. PATENT DOCUMENTS

| | | | |
|---|---|---|---|
| 6,501,020 B2 | 12/2002 | Grant et al. | |
| 6,522,551 B2 | 2/2003 | Hsu et al. | |
| 6,600,656 B1 | 7/2003 | Mori et al. | |
| 6,621,692 B1* | 9/2003 | Johnson et al. | 361/679.55 |
| 7,040,491 B1 | 5/2006 | Claprood et al. | |
| 7,258,583 B1* | 8/2007 | Baiza | 439/719 |
| 7,307,835 B1 | 12/2007 | Barina et al. | |
| 7,505,251 B2 | 3/2009 | Canfield et al. | |
| 7,516,917 B2 | 4/2009 | Rubernstein | |
| 7,822,311 B2* | 10/2010 | Stansbury et al. | 385/135 |
| 8,413,385 B2 | 4/2013 | Mahoney | |
| 8,459,000 B2* | 6/2013 | Harada | 59/78.1 |
| 8,599,550 B2 | 12/2013 | Davis et al. | |
| 8,817,464 B2 | 8/2014 | Jau et al. | |
| 8,864,379 B2 | 10/2014 | Hays et al. | |
| 8,891,233 B2 | 11/2014 | Giardina et al. | |
| 2005/0155337 A1* | 7/2005 | Worms | 59/78.1 |
| 2006/0030174 A1* | 2/2006 | Tsubaki et al. | 439/76.2 |
| 2007/0233781 A1* | 10/2007 | Starr et al. | 709/203 |
| 2007/0270180 A1* | 11/2007 | Takagi | 455/550.1 |
| 2007/0277499 A1* | 12/2007 | Iwami et al. | 59/78.1 |
| 2008/0144293 A1 | 6/2008 | Aksamit et al. | |
| 2008/0179456 A1* | 7/2008 | Diergardt | 244/118.1 |
| 2009/0167825 A1* | 7/2009 | Kawamura et al. | 347/85 |
| 2010/0038495 A1* | 2/2010 | Jinushi et al. | 248/68.1 |
| 2010/0148647 A1 | 6/2010 | Burgess et al. | |
| 2010/0172087 A1* | 7/2010 | Jeffery et al. | 361/679.33 |
| 2011/0005264 A1* | 1/2011 | Lee et al. | 62/449 |
| 2011/0050065 A1* | 3/2011 | Lee et al. | 312/402 |
| 2011/0228491 A1* | 9/2011 | Sakai et al. | 361/749 |
| 2014/0033851 A1* | 2/2014 | Hermey et al. | 74/490.02 |
| 2014/0055959 A1 | 2/2014 | Manda | |
| 2014/0182262 A1* | 7/2014 | Komiya | 59/78.1 |
| 2014/0265793 A1 | 9/2014 | Evans et al. | |

OTHER PUBLICATIONS cableorganizer.com, "Cable Management—Organize Cords & Wires", Retrieved on Dec. 4, 2014, from: http://www.cableorganizer.com/cable-management/. (2 pages).

Middle Atlantic Products, "Universal Mounting Drawer", Retrieved on Dec. 4, 2014, from: http://www.middleatlantic.com/products/accessories/rackmount-storage/universal-mounting-drawer.aspx (2 pages).

Rackmount Solutions, "Rackmount Solutions: Rack Mount Shelves & Accessories for Server Racks & Cabinets", Retrieved on Dec. 12, 2014, from: http://www.rackmountsolutions.net/Rackmount_Shelves.asp. (2 pages).

* cited by examiner

CABLE STORAGE UNDER A DRAWER

TECHNICAL FIELD

The disclosure generally relates to cable organization in a server chassis.

BACKGROUND

Cables used in connecting hardware on a server (e.g., hard drives, motherboard, etc.) to a server chassis are prone to being tangled when the server or hard disk drawer is pulled out and pushed back into the chassis. Conventionally, a cable support mechanism is used for solving this problem. For example, a cable arm positioned at the back of the chassis is adapted to extend and retract along with the server or hard disk drawer while also supporting the cables. The cables are attached to the cable arm, which comprises a foldable set of bars. However, cable arms require a lot of space and also obstruct heat dissipation from the server blade out of the chassis.

SUMMARY

In some implementations, an apparatus can be configured to store cables underneath a hardware drawer of a computing device. The apparatus comprises a wall of a drawer adapted to secure a set of cables at a first end. For example, the wall can be coupled to a roller and a flattening appendage. The cables can be housed in a cable housing. The cable housing can be a Mylar™ belt. Mylar™ is a polyester film made from stretched polyethylene terephthalate (PET) manufactured by E. I. du Pont de Nemours and Company. The cable housing can be a microchain. In some implementations, the apparatus can comprise a deck comprising a plate adapted to secure the set of cables at a second end, the plate located at a midpoint of the deck. Alternatively, a drawer is adapted to slide along the deck, a shelf attached to the drawer. The flattening appendage presses down on the first end of the set of cables and the roller presses down on the second end of the set of cables as the drawer is opened and closed such that the set of cables is stored neatly under the drawer.

Particular implementations provide at least the following advantages: Compact storage and organization of server cables underneath a server blade, additional space available at the rear of a server chassis, and improved heat dissipation from the server blade out of the server chassis due to less clutter at the rear of the chassis.

Details of one or more implementations are set forth in the accompanying drawings and the description below. Other features, aspects, and potential advantages will be apparent from the description and drawings, and from the claims.

DESCRIPTION OF DRAWINGS

Like reference symbols in the various drawings indicate like elements.

DETAILED DESCRIPTION

Figure 1A:
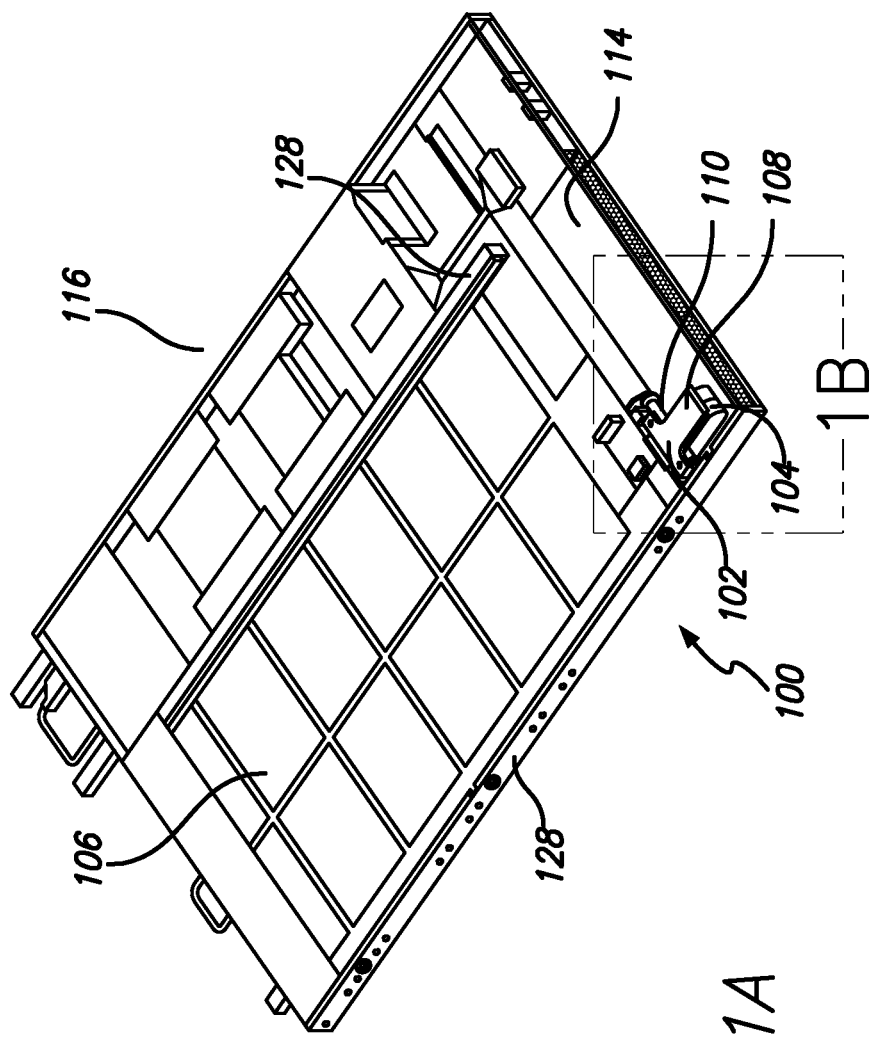
FIG. 1A is an isometric view of a cable storage apparatus showing a drawer in a closed position with cables stored underneath the drawer.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and members have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening members, and is not necessarily limited to physical connections. The connection can be such that the objects are permanently connected or releasably connected. The term "substantially" is defined to be essentially conforming to the particular dimension, shape or other word that substantially modifies, such that the member need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

In practice, as a drawer is pulled out of a chassis from a closed position, to a halfway open position, to an open position, cables that are completely stored underneath the drawer become exposed and fully extended. As the drawer is closed, the cables return under the drawer until they are fully stored underneath the drawer. The space saved from having the cables stored underneath the drawer allows for more space on the drawer for hardware, and improved ventilation at the rear of the chassis for heat dissipation.

Figure 1B:
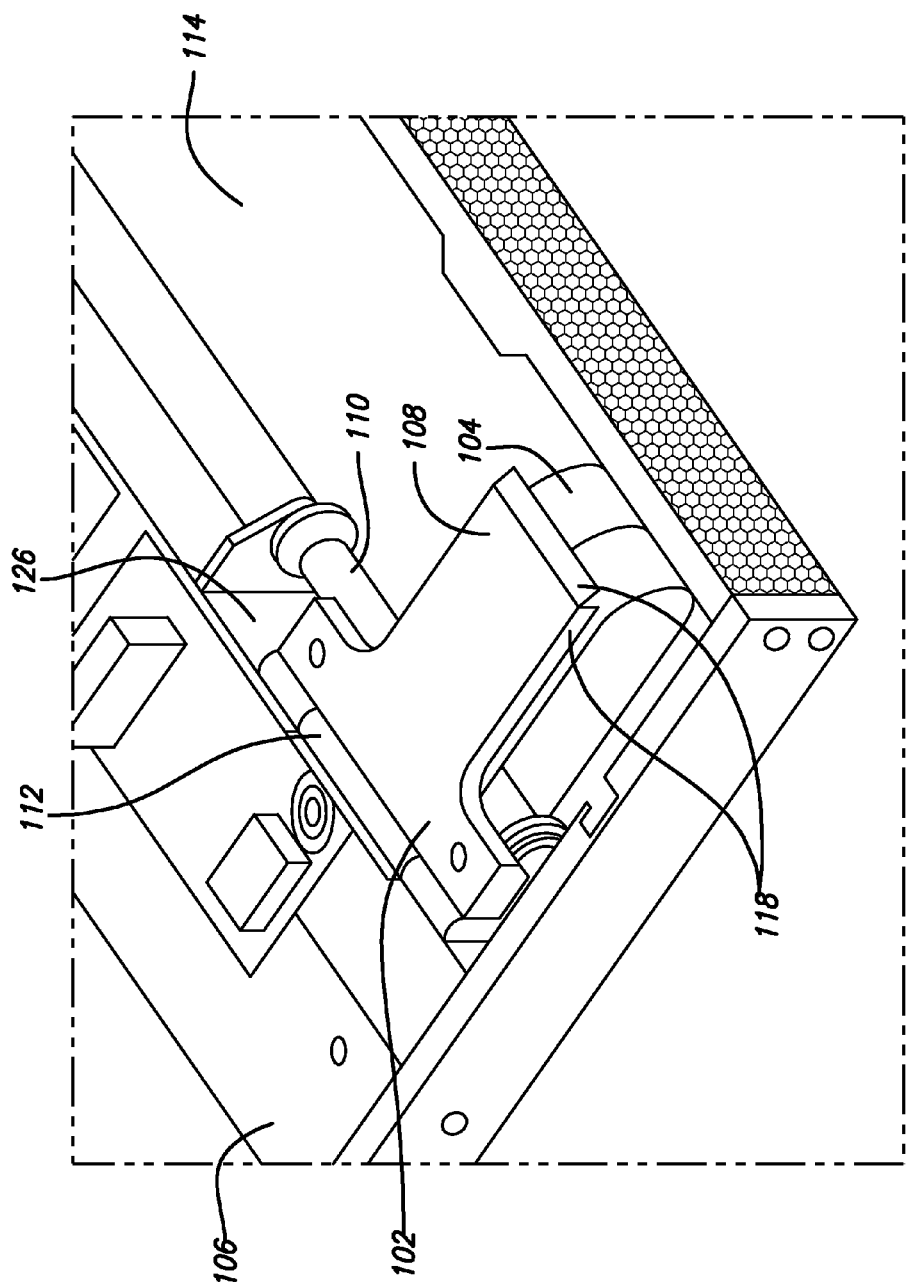
FIG. 1B is a close-up view of the apparatus of FIG. 1A.

FIGS. 1A and 1B illustrate an example cable storage apparatus 100 for storing cables 104 underneath drawer 106 (e.g. a hard drive drawer, server drawer, etc.) while drawer 106 is in a fully closed position. As shown in FIGS. 1A and 1B, drawer 106 is in a fully closed position, with cables 104 stored completely underneath drawer 106. In some implementations, rear wall 126 can be used to secure a first end (e.g., upper end) of cables 104. This can be accomplished by any means known in the art. For example, a securing piece (not shown) can be coupled to rear wall 126 such that cables 104 are sandwiched between the securing piece and rear wall 126. The securing piece can be coupled to rear wall 126 according to means known in the art, including, but not limited to, snap attachments, screws, friction fit, etc. Alternatively, the securing piece can be coupled to shelf 102 using similar means. For example, cables 104 can be sandwiched between the securing piece and shelf 102, and securing piece can be attached either above or below shelf 102.

In some implementations, shelf 102 can be substantially flat in shape, and can be made of metal, plastic, rubber, etc. Alternatively, shelf can comprise cable aperture 112 for cables 104 to pass through to couple with cable couplings located on drawer 106. In some implementations shelf 102 is attached to rear wall 126 of drawer 106. Attachment of shelf 102 to drawer 106 can be accomplished using any means known in the art, including, but not limited to, screws, friction fit, snap attachment, etc. For example, shelf 102 can be fixed in place on drawer 106 such that a first end of cables 104 follows the motion of drawer 106 as drawer 106 is pulled out and pushed in from chassis 116. Alternatively, shelf 102 can be fixed closer to one side of chassis 116.

In some implementations, chassis 116 can be adapted to work in combination with drawer 106 to allow drawer 106 to be opened and closed (e.g. similar to a desk drawer). For example, chassis 116 can include side walls 128 with guiding portions and drawer 106 can include sliding portions that slide along the guiding portions. Guiding portions can include wheels and locking mechanisms to prevent drawer 106 from sliding out all the way. Drawer 106 can include wheels and locking mechanisms that move through the guiding portions to allow drawer 106 to slide into and out of chassis 116. Alternatively, the width of drawer 106 can be smaller than the width of chassis 116. For example, one of the side walls 128 can be positioned closer to the other side wall 128 to support drawer 106 (see e.g., FIG. 1A).

In some implementations shelf 102 can comprise roller 110. For example, roller 110 can be substantially cylindrical in shape and can be made of any material known in the art with frictional characteristics such as, but not limited to, plastic, rubber, etc. Alternatively, roller 110 can be located below shelf 102 and can be used for pushing down a second end (e.g., lower end) of cables 104 towards deck 114 as drawer 106 is opened and closed. For example, roller 110 can be adapted to roll along the second end of cables 104 according to methods known in the art, including, but not limited to, bearings, axles, wheels, etc., to push or press the second end of the cables to the floor of the chassis. Roller 110 therefore helps keep cables 104 organized while guiding cables 104 underneath drawer 106. Alternatively, roller 110 can be the same width as cables 104.

In some implementations, shelf 102 can comprise flattening appendage 108. Flattening appendage 108 can be a flat and rigid planar extension of shelf 102. For example, flattening appendage 108 can be used to flatten a first end of cables 104 as shelf 106 is opened and closed. As shelf 106 gets closer to the rear of chassis 116, cables 104 tend to bunch and spring up. Flattening appendage 108 ensures that cables 104 remain pressed down, organized and do not bunch up. Alternatively, flattening appendage 108 can be the same width as cables 104, and can further comprise guides 118 for keeping cables 104 underneath flattening appendage 108. Flattening appendage can be made of the same material as shelf 102, as described above.

Figure 2A:
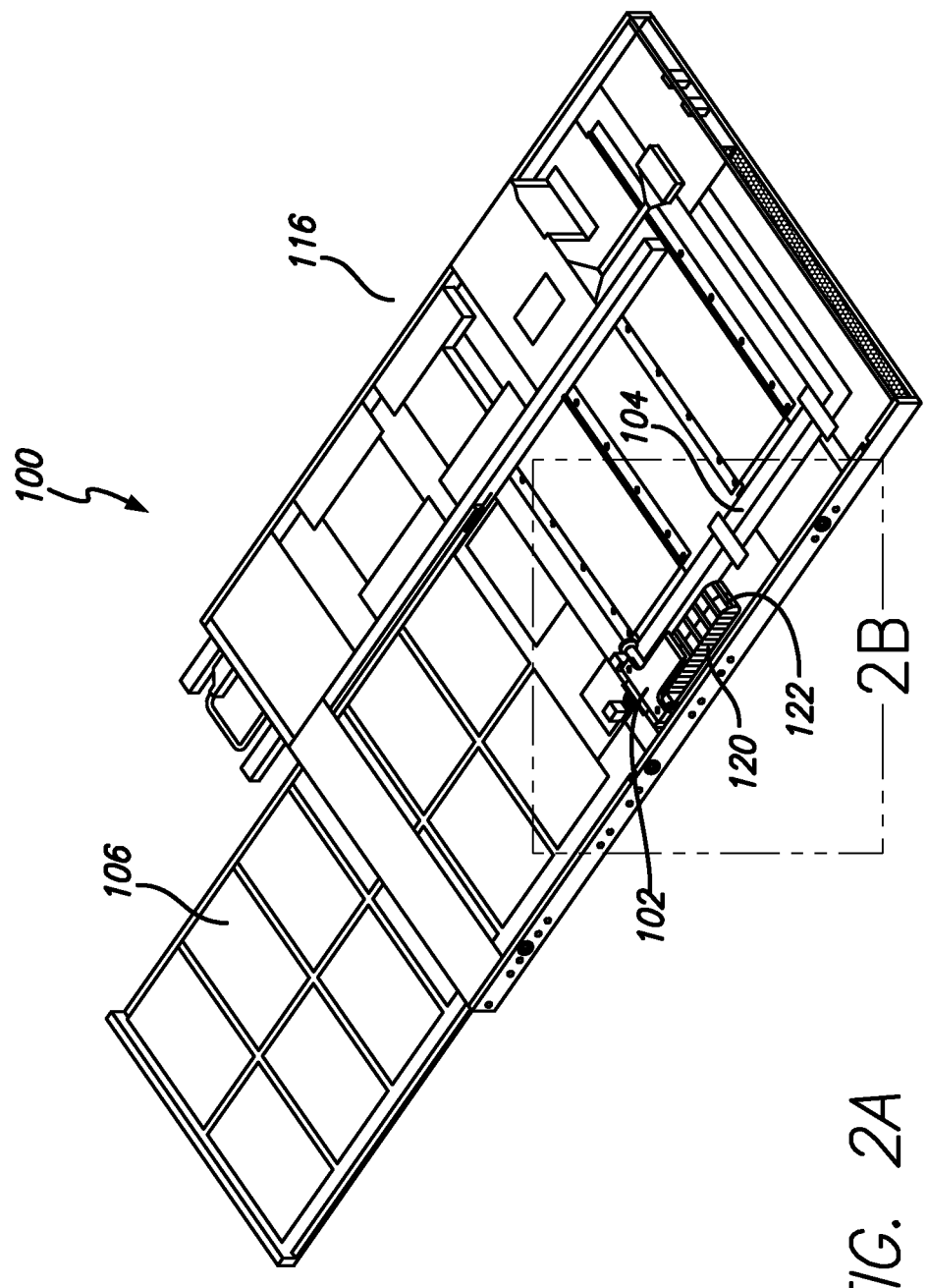
FIG. 2A is an isometric view of a cable storage apparatus showing the drawer pulled halfway out.
Figure 2B:
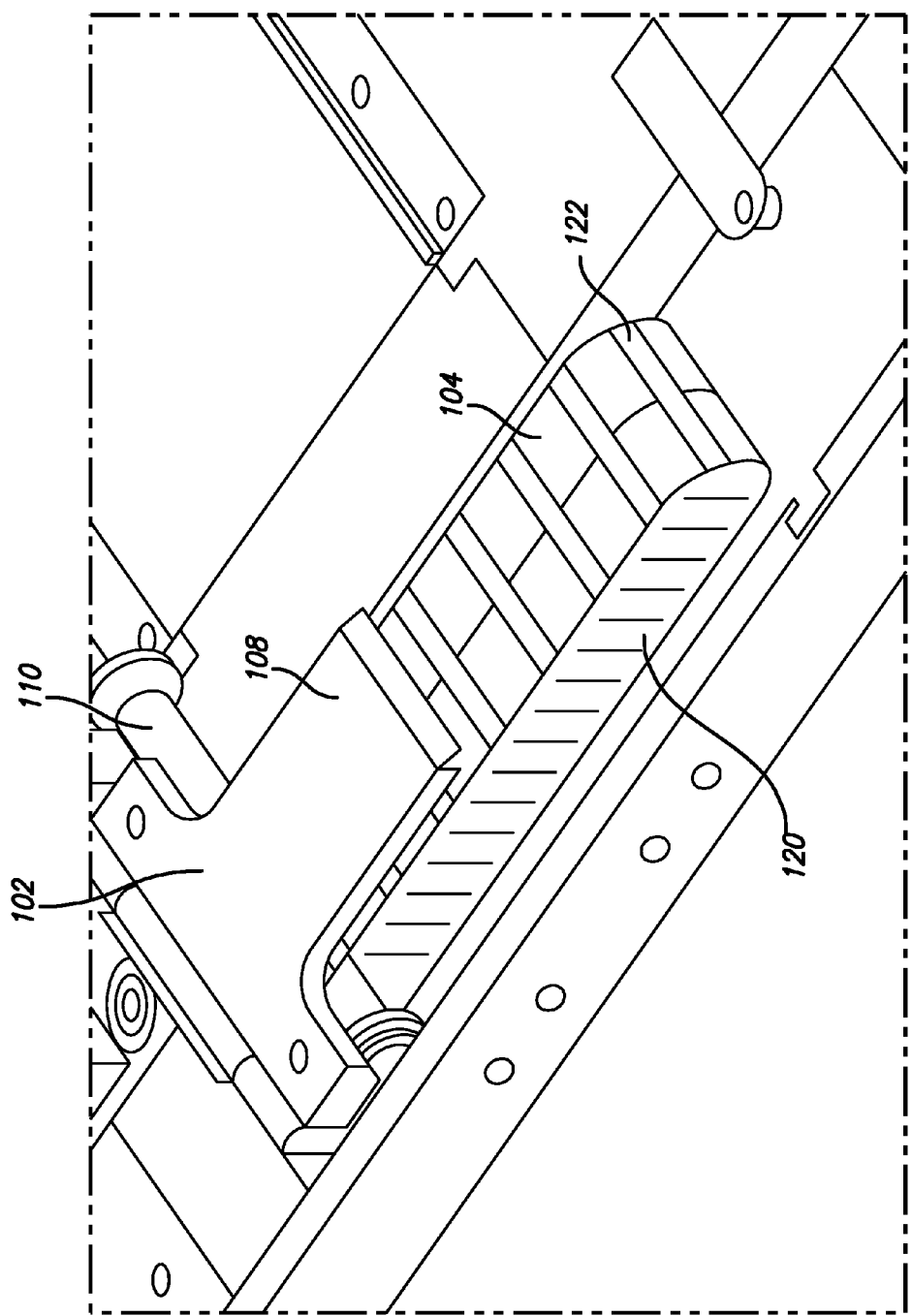
FIG. 2B is a close-up view of the apparatus of FIG. 2A.

FIGS. 2A and 2B illustrate drawer 106 half open with cables 104 housed inside a cable housing 120. For example, cable housing 120 keeps cables 104 together and organized. In some implementations, cable housing 120 can include a Mylar™ belt. In some implementations, cable housing 120 can include a microchain. As drawer 106 is opened from the closed position in FIGS. 1A and 1B to the half open position depicted in FIGS. 2A and 2B, a second end of cables 104 (e.g., the lower portion) that was previously stored beneath drawer 106 becomes exposed. Roller 110 rolls over cables 104 to ensure smooth deployment of the second end of cables 104, and flattening appendage 108 ensures the first end of cables 104 remains flat.

Figure 3A:
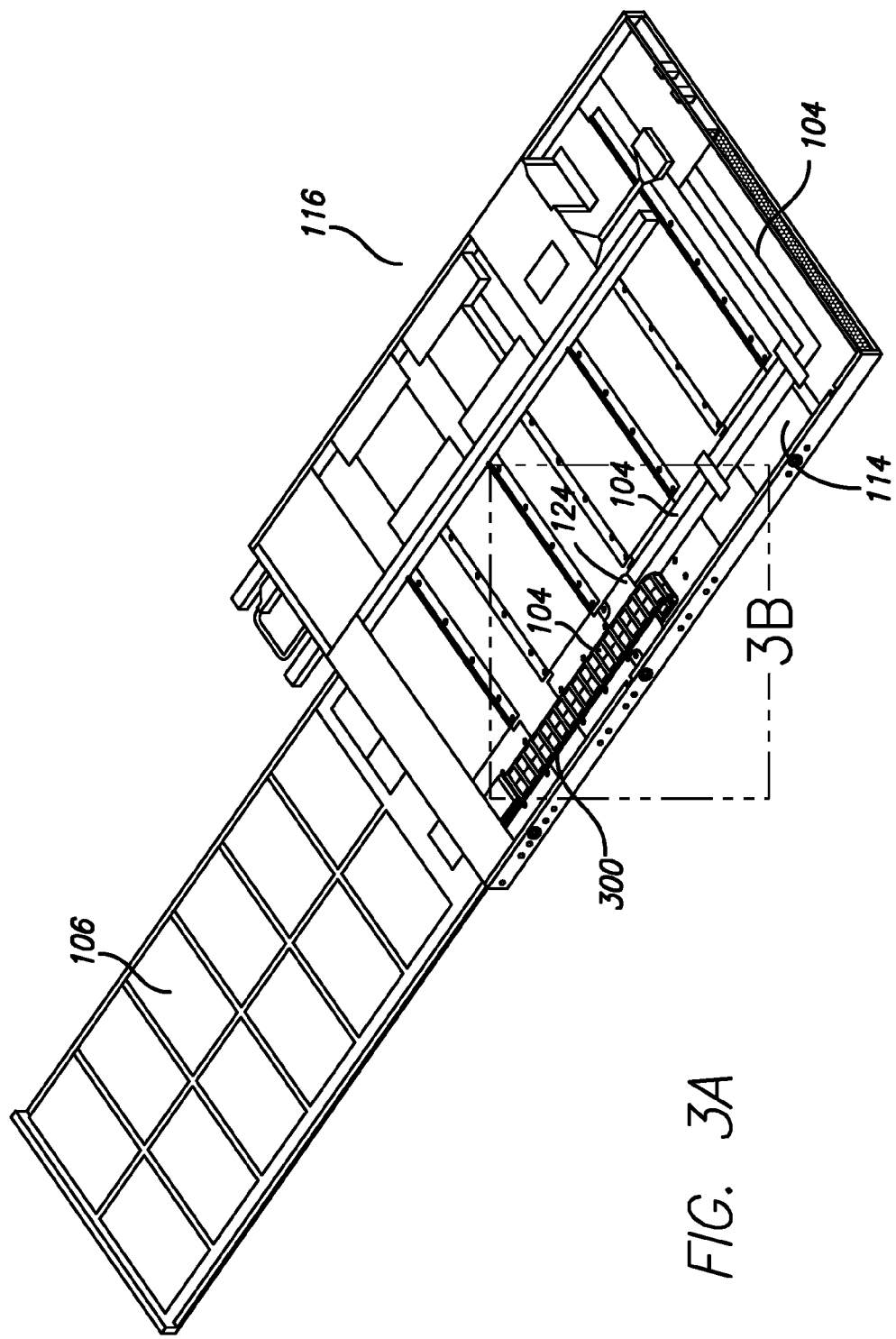
FIG. 3A is an isometric view of a cable storage apparatus showing the drawer pulled all the way out.
Figure 3B:
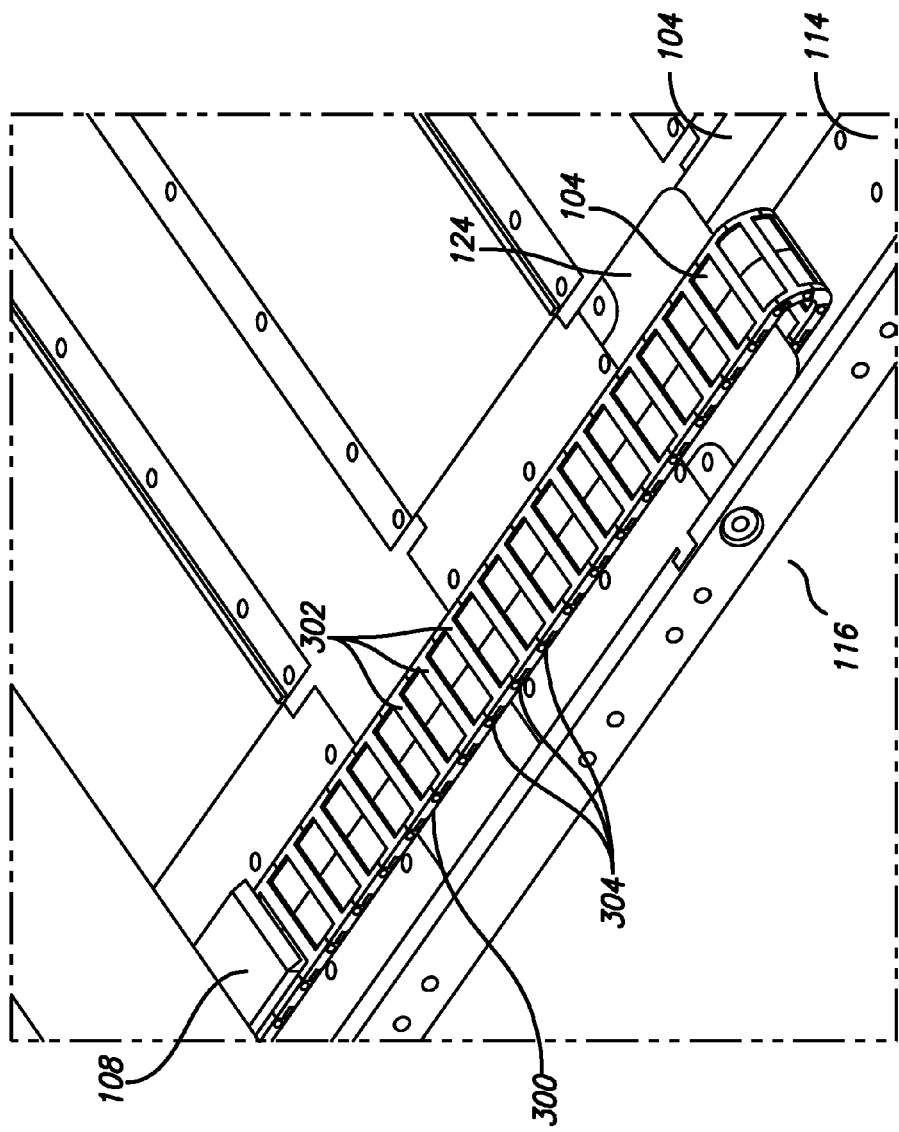
FIG. 3B is a close-up view of the apparatus of FIG. 3A.

In some implementations, cable housing 120 comprises a Mylar™ belt. Mylar™ is a polyester film made from stretched polyethylene terephthalate (PET) and is used for high tensile strength, chemical and dimensional stability, transparency, reflectivity, gas and aroma barrier properties, and electrical insulation. Alternatively, the Mylar™ belt can comprise securing straps 122 that span across the width of cables 104 to secure cables 104 to the Mylar™ belt. In some implementations, securing straps 122 are also made of Mylar™. For example, the Mylar™ belt can be situated on one side of cables 104, as securing straps 122 span across the opposite side (as shown in FIGS. 2A and 2B). The Mylar™ belt can house cables 104 to keep them together while shelf 102 pushes and pulls against cables 104 as drawer 106 is opened and closed. The Mylar™ belt can add rigidity to cables 104 to prevent pinching or binding of cables 104. Alternatively, cable housing can be adapted to span the portion of cables 104 between shelf 102 and plate 124 (as shown in FIGS. 3A and 3B). In some implementations, cable housing 120 can comprise a microchain for securing cables 104, as described below with reference to FIG. 3.

FIGS. 3A and 3B illustrate drawer 106 fully open with cables 104 housed inside microchain 300. When drawer 106 is fully open, cable 104 is fully extended and exposed.

In some implementations, a second end of cables 104 can be secured on deck 114. For example, the second end of cables 104 can be secured underneath plate 124. Plate 124 can be secured to deck 114 (e.g., the bottom of the chassis) according to means known in the art, including, but not limited to, screws, snap fit, friction fit, hinges, etc. Alternatively, plate 124 can be adapted to open and close to easily allow securing of cables 104 to deck 114. Cables 104 fold underneath plate 124 and continue towards the rear of chassis 116 (as shown in FIG. 3B). In some implementations, plate 124 can be located at a midway point of deck 114. Alternatively, plate 124 can be located at a midway point of deck 114 and towards a side of chassis 116. In some implementations, shelf 102 is attached to rear wall 126 such that shelf 102 is in line with plate 124.

Because the first and second ends of cables 104 are secured at shelf 102 and under plate 124, the free movement of cables 104 is limited. Cable housing 120 that spans between shelf 102 and plate 124 further limits the free movement of cables 104. As a result, drawer 106 can be opened and closed with minimal interruption from cables 104.

In some implementations, microchain 300 can comprise a plurality of segments 302 interlinked together through joints 304 such that joints 304 are pivotable and allow microchain 300 as a whole to be flexible to move with cables 104. Segments 302 can be adapted to house cables 104 and provide support above and below cables 104. For example, cables 104 can reside within microchain 300, and microchain 300 keeps cables 104 organized. Joints 304 can be interlinked according to methods known in the art, including, but not limited to, interlocking links, pivoting joints, knuckle joints, etc.

Figure 4:
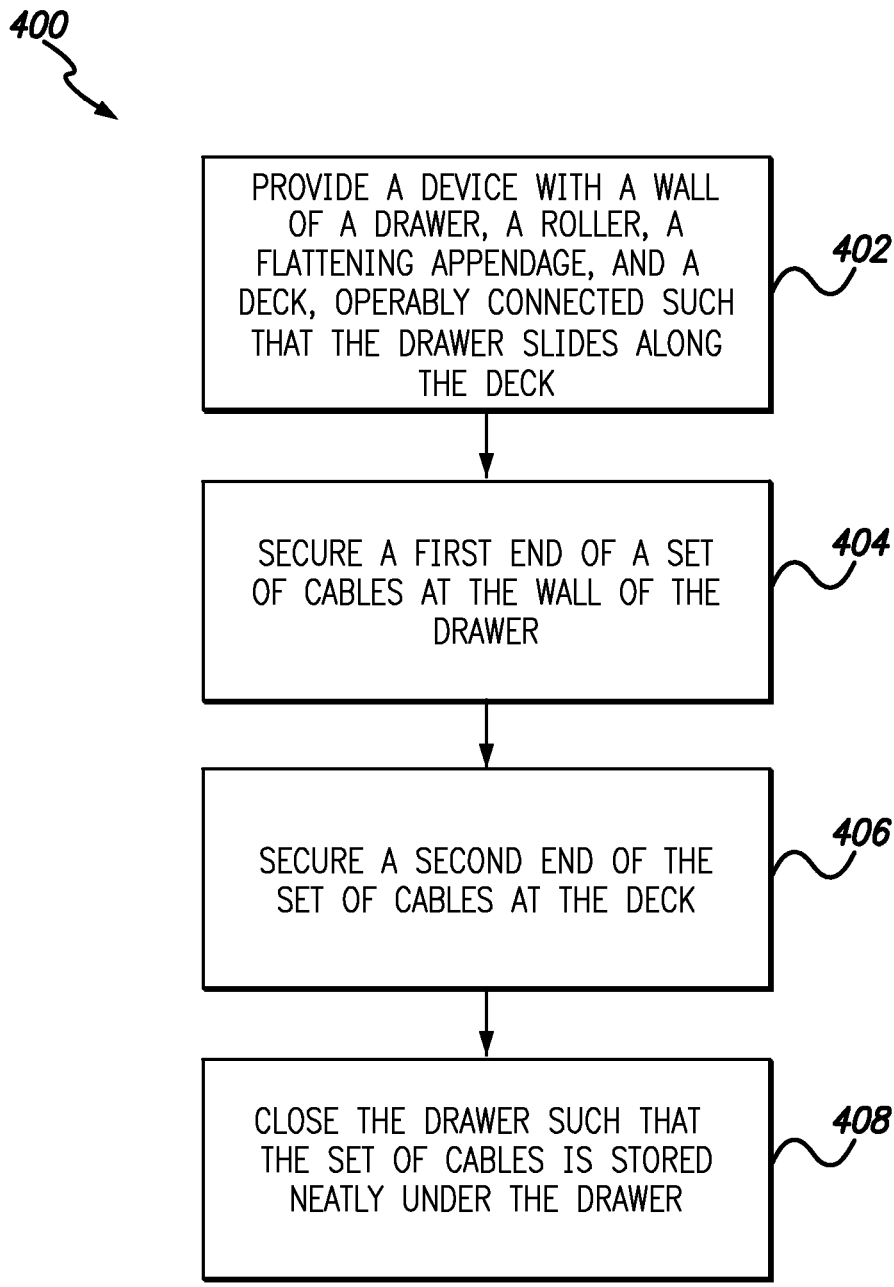
FIG. 4 is a flow diagram of an example method for storing a cable under a drawer.

Referring to FIG. 4 is a flow diagram 400 of an example method for storing a cable under a drawer. The method described below can be carried out using the configurations illustrated in FIGS. 1-3, for example, and various elements of these figures are referenced in explaining the example method. Each block shown in FIG. 4 represents one or more processes, methods or subroutines, carried out in the example method. Furthermore, the illustrated order of blocks is illustrative only and the order of the blocks can change according to the present disclosure. Additional blocks can be added or fewer blocks may be utilized, without departing from this disclosure. The example method begins at block 402.

At block 402, a device is provided with a wall of a drawer, a roller, a flattening appendage, and a deck comprising a plate, operably connected such that the drawer slides along the deck. The device can be structured according any of the described implementations above for cable storage under a drawer.

At block 404, a first end of the set of cables is secured at the wall of the drawer. The first of end of the set of cables can be secured according to above-described implementations, including, but not limited to, using a securing piece.

At block 406, a second end of the set of cables is secured at the plate. In some implementations, the deck comprises a plate for securing the set of cables, as described above.

At block 408, the drawer is closed such that the flattening appendage presses down on the first end of the set of cables and the roller presses down on the second end of the set of cables such that the set of cables is stored under the drawer. The roller and flattening appendage work in combination to keep the set of cables organized and from rising up as the drawer is closed, as described above. In some implementations, a cable housing is used to keep the set of cables together and organized, as described above.

A number of implementations have been described. Nevertheless, it will be understood that various modifications may be made. For example, other steps may be provided, or steps may be eliminated, from the described methods, and other components may be added to, or removed from, the described systems. Accordingly, other implementations are within the scope of the following claims.

For clarity and simplicity, only drawer 106 is described. However, multiple drawers comprising multiple shelves and chasses can be supported by the above disclosure. For example, multiple drawers can be stored on top of each other, as commonly known in server architecture, each chassis adapted store cables underneath each drawer according to the disclosure herein.

Although a variety of examples and other information were used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

What is claimed is:

1. An apparatus comprising:
  a wall of a drawer adapted to secure a set of cables at a first end, the wall comprising a roller and a flattening appendage extending therefrom;
  a deck comprising a plate, the plate adapted to secure the set of cables at a second end; and
  the drawer adapted to slide along the deck and over the plate;
  wherein the flattening appendage presses down on the first end of the set of cables and the roller guides a first portion of the set of cables between the first end and the second end as the drawer is closed such that the first portion of the set of cables is stored under the drawer and a second portion between the first end and the second end of the set of cables is bent and is disposed between the flattening appendage and the roller.

2. The apparatus of claim 1, wherein the wall comprises a securing piece for securing the set of cables.

3. The apparatus of claim 1, further comprising a cable housing for housing the set of cables and securing the cables together.

4. The apparatus of claim 3, wherein the cable housing comprises a polymer belt.

5. The apparatus of claim 3, wherein the cable housing comprises a microchain.

6. The apparatus of claim 3, wherein the cable housing spans the set of cables between the first end and the second end.

7. The apparatus of claim 2, wherein the securing piece attaches below the flattening appendage.

8. A method comprising:
  providing a device with a wall of a drawer, a roller, a flattening appendage, and a deck comprising a plate, operably connected such that the drawer slides along the deck;
  securing a first end of the set of cables to the wall of the drawer;
  securing a second end of the set of cables to the plate; and
  closing the drawer such that the flattening appendage presses down on the first end of the set of cables and the roller guides a first portion of the set of cables between the first end and the second end such that the first portion of the set of cables is stored under the drawer and a second portion between the first end and the second end of the set of cables is bent and is disposed between the flattening appendage and the roller.

9. The method of claim 8, wherein the wall comprises a securing piece for securing the set of cables.

10. The method of claim 8, further comprising a cable housing for housing the set of cables and securing the cables together.

11. The method of claim 10, wherein the cable housing a polymer belt.

12. The method of claim 10, wherein the cable housing comprises a microchain.

13. The method of claim 10, wherein the cable housing spans the set of cables between the first end and the second end.

14. The method of claim 9, wherein the securing piece attaches below the flattening appendage.

15. A system comprising:
  an apparatus comprising:
    a wall of a drawer adapted to secure a set of cables at a first end;
    a roller; and
    a flattening appendage;
  a deck comprising a plate, the plate adapted to secure the set of cables at a second end; and
  the drawer adapted to slide along the deck;
    wherein the flattening appendage presses down on the first end of the set of cables and the roller guides a first portion of the set of cables between the first end and the second end as the drawer is closed such that the first portion of the set of cables is stored under the drawer and a second portion between the first end and the second end of the set of cables is bent and is disposed between the flattening appendage and the roller.

16. The system of claim 15, wherein the wall comprises a securing piece for securing the set of cables.

17. The system of claim 15, further comprising a cable housing for housing the set of cables and securing the cables together.

18. The system of claim 17, wherein the cable housing comprises a microchain.

19. The system of claim 17, wherein the cable housing a polymer belt.

20. The system of claim 17, wherein the cable housing spans the set of cables between the first end and the second end.

\* \* \* \* \*